United States Patent [19]

Yamamoto et al.

[11] Patent Number: 4,981,712
[45] Date of Patent: Jan. 1, 1991

[54] METHOD OF PRODUCING THIN-FILM ELECTROLUMINESCENT DEVICE USING CVD PROCESS TO FORM PHOSPHOR LAYER

[75] Inventors: Yuji Yamamoto; Tsuyoshi Maekawa, both of Matsusaka; Kazutoshi Nakaya, Mie, all of Japan

[73] Assignee: Central Glass Company, Limited, Ube, Japan

[21] Appl. No.: 357,218

[22] Filed: May 26, 1989

[30] Foreign Application Priority Data

May 27, 1988 [JP] Japan .................................. 63-128291

[51] Int. Cl.$^5$ ............................................. B05D 3/06
[52] U.S. Cl. ........................................ 427/38; 427/66; 427/69; 427/126.1; 427/126.2
[58] Field of Search ................... 427/38, 66, 69, 126.2, 427/126.1

[56] References Cited

U.S. PATENT DOCUMENTS 4,804,558 2/1989 Saitoh et al. ........................... 427/66

FOREIGN PATENT DOCUMENTS 62-98596 5/1987 Japan .

Primary Examiner—Stanley Silverman
Attorney, Agent, or Firm—Fleit, Jacobson, Cohn, Price, Holman & Stern

[57] ABSTRACT

In producing a thin-film electroluminescent device having a ZnS:Mn film deposited by a MOCVD process using a mixed gas containing an organic zinc compound, an organic sulfur compound and an organic manganese compound, either methyl mercaptan or ethyl mercaptan is used as the sulfur compound and di$\pi$-cyclopentadienylmanganese as the manganese compound. The zinc compound is preferably dimethylzinc or diethylzinc. As the merits of using such a combination of organic metal compounds the MOCVD operation can be accomplished at a relatively low substrate temperature, and the deposited ZnS:Mn film is high in the light emitting efficiency and low in the threshold voltage.

5 Claims, 2 Drawing Sheets

METHOD OF PRODUCING THIN-FILM ELECTROLUMINESCENT DEVICE USING CVD PROCESS TO FORM PHOSPHOR LAYER

BACKGROUND OF THE INVENTION

This invention relates to a method of producing a thin-film electroluminescent device in which the electroluminescent phosphor layer is a thin film of zinc sulfide doped with manganese (ZnS:Mn), the method using a chemical vapor deposition process to form the ZnS:Mn film.

In place of electroluminescent (EL) devices having an active layer formed of a dispersion of EL phosphor particles in plastic or ceramic, recently much attention has been directed to thin-film EL devices having a thin film of an EL phosphor as the active layer. As the EL phosphor, ZnS:Mn is prevailing.

In producing thin-film EL devices usually the phosphor film is formed by a physical vapor deposition technique such as vacuum evaporation by electron-beam heating or sputtering. In practice, however, there are many problems which are difficult to solve completely. In the case of vacuum evaporation by electron-beam heating the problems include ejection and scattering of clusters of the evaporating material from the crucible as a cause of surface defects (1-10 $\mu$m in diameters) in the deposited film high probabilities of pinholes in the deposited film and unevenness of the deposited film as an inevitable result of evaporating the phosphor material substantially in one point. In the case of sputtering the problems include damaging of the deposited film by the secondary electrons emitted from the target, intrusion of the sputtering gas into the deposited film and changes in the chemical composition of the target surface during the sputtering operation.

There is a proposal of depositing a ZnS:Mn film by a so-called metal-organic chemcial vapor deposition (MOCVD) process using a mixed gas containing an organic zinc compound such as dimethylzinc or diethylzinc, an organic sulfur compound such as dimethyl suflfide, diethyl sulfide or hydrogen sulfide and an organic manganese compound (e.g. JP-A No. 62-98596). However, when dimethyl sulfide or diethyl sulfide is used it is necessary to keep the substrate heated at a temperature about 500° C. for accomplishing CVD, and even though the substrate temperature is so high the rate of growth of a ZnS:Mn film is very low. When hydrogen sulfide is used there occurs a vapor phase reaction between the sulfide and the organic zinc compound to form solid particles of zinc sulfide precedent to the decomposition of the gaseous compounds on the substrate surface, and it is inevitable that the solid particles adversely influence the quality of the deposited film.

SUMMARY OF THE INVENTION

It is an object of the present invention to provide an improved method of producing a thin-film EL device having a ZnS:Mn film as the active layer, which method enables to accomplish a MOCVD operation for forming the ZnS:Mn film without undesirably intensely heating the substrate and to deposit a uniformly healthy ZnS:Mn film in which the crystals are uniformly and favoraly oriented.

A thin-film EL device to be produced by a method according to the invention has a thin film of ZnS:Mn as ans EL phosphor layer, a pair of electordes located on the opposite two sides of the phosphor layer, respectively, and a dielectric layer interposed between the phosphor layer and each or predetermined one of the two electrodes, and the method includes depositing the thin film of ZnS:Mn by a MOCVD process using a mixed gas containing an orgainc zinc compound, an organic sulfur compound and an organic manganese compound. According to the invention, the mixed gas contains either methyl mercaptan or ethyl mercaptan as the organic sulfur compound and di-$\pi$-cyclopentadienylmanganese as the organic manganese compound. Usually the organic zinc compound is either dimethylzinc or diethylzinc.

The use of such a combination of organic zinc, sulfur and manganese compounds in the raw material gas for a MOCVD process to deposit a ZnS:Mn film has advantages in various respects. First, in performing the MOCVD operation the substrate can be maintained at a temperature lower than 500° C. Furthermore, it is possible to form a uniformly dense and defectless phosphor film with high accuracy and good reproducibility, and in the deposited ZnS:Mn film the crystals are uniformly and favorably oriented as will be described hereinafter, and therefore the deposited ZnS:Mn film is low in the threshold voltage for emission of light and high in the light emitting efficiency.

Besides, when the transparent electrode in the thin-film EL device is in the form of a series of stripes so that the substrate surface has stepped regions it is also a merit of the method according to the invention that the deposited phosphor film is excellent in the step coverage, so that the thin-film EL device is high in dielectric breakdown voltage. Therefore, it is possible to reduce the thickness of the ZnS:Mn film to thereby further lower the threshold voltage for emission of light.

In this invention it is preferred to form each dielectric layer in the thin-film EL device by a plasma CVD procss. Compared with PVD processes such as vacuum evaporation and sputtering an advantage of plasma CVD resides in better uniformity of the thickness of the deposited film. Compared with a thermal CVD process in which the raw material gas is not excited to a plasma, the primary merit of plasma CVD is that the substrate temperature can be lowered. Therefore, it is not necessary to use a highly heat-resistant substrate, and the deposition of the phosphor film can be accomplished without adversely influencing the precedingly deposited transparent electrode which is not very high in heat resistance. Besides, when the transparent electrode is in the form of a series of strips so that the substrate surface has stepped regions the dielectric layer formed by plasma CVD is good in the step coverage and, hence, enhances the dielectridc breakdown strength of the EL device. As the joint effect of such a dielectric layer and a ZnS:Mn layer formed by MOCVD using the above described combination of organic compounds, the threshold voltage for light emission of the thin-film EL device further lowers.

DESCRIPTION OF THE PREFERRED EMBODIMENTS

Figure 1:
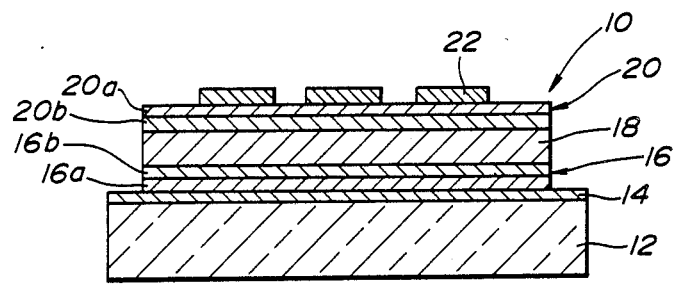
FIG. 1 is a schematic and sectional view of a thin-film EL device produced by a method according to the invention.

FIG. 1 shows a thin-film EL device 10 produced by a method according to the invention. The mechanically basic part of the EL device 10 is a transparent substrate 12 such as a glass substrate. A transparent electrode film 14 such as a $SnO_2$ film is deposited on a major surface of the transparent substrate 12. The electrode film 14 is etched so as to form a series of parallel stripes. A first dielectric layer 16 is deposited on the electrode film 14. In this example, the dielectric layer 16 consists of a $SiO_2$ film 16a which is in contact with the electrode film 14 and a $Si_3N_4$ film 16b which overlies the $SiO_2$ film 16a. On the $Si_3N_4$ film 16b of the dielectric layer 16 there is deposited a thin film of an EL phosphor 18, which is ZnS:Mn in the present invention. The phosphor film 18 is overlaid with a second dielectric layer 20. In this example the second dielectric layer 20 too consists of a $Si_3N_4$ film 20b which is in contact with the phosphor film 18 and a $SiO_2$ film 20a which overlies the $Si_3N_4$ film 20b. On the dielectric layer 20 there is another electrode film 22, which is in the form of a series of parallel stripes oriented crosswise of the stripes of the inner electrode 12. The outer electrode film 22 does not need to be transparent.

In this thin-film EL device 10 each of the two dielectric layers 16 and 20 is constituted of a $SiO_2$ film 16a (20a) and a $Si_3N_4$ film (20b). The two-layer structure is favorable for enhancement of the dielectric breakdown strength of the EL device 10 because each of the two films of each dielectric layer serves the purpose of filling in defects such as pin-holes and clusters in the opposite film. However, the two-layer structure is not an indispensable requisite. Each of the two dielectric layers 16 and 20 may be a single layer of either $SiO_2$ or $Si_3N_4$, or a still different dielectric material such as $TiO_2$ or $Al_2O_3$. The second dielectric layer 20 is indispensable. The provision of the first dielectric layer 16 is preferable since dielectric strength of the thin-film EL device is enhanced by sandwiching the phosphor layer 18 between two dielectric layers, but it is permissible to omit the first dielectric layer 16. As mentioned hereinbefore, in the present invention it is preferred to form each of the dielectric layers 16 and 20 by a plasma CVD process.

According to the invention the ZnS:Mn film as the EL phosphor layer 1, is formed by a MOCVD processing using a mixed gas including an organic zinc compound, preferably either dimethylzinc $(CH_3)_2Zn$ or diethylzinc $(C_2H_5)_2Zn$, an organic sulfur compound selected from methyl mercaptan $CH_3SH$ and ethyl mercaptan $C_2H_5SH$ and a specific organic manganese compound, viz. di-$\pi$-cyclopentadienylmanganese $(C_5H_5)_2Mn$. Ususlly the mixed gas further includes a carrier gas for carrying the vapor of di-$\pi$-cyclopentadienylmanganese.

EXAMPLE 1

A thin-film EL device of the construction shown in FIG. 1 was produced in the following way.

A plate of an alkaliless glass was used as the transparent substrate 12. On one surface of the glass substrate 12 a film of $SnO_2$ was deposited by an ordinary CVD process using a heated vapor containing an organic tin compound and a fluorine compound. The $SnO_2$ film was etched with a slurry prepared by dispersing zinc powder in a suspension of cornstarch in an aqueous solution of HCl so as to form the transparent electrode 14 in the shape of a series of parallel stripes.

Figure 2:
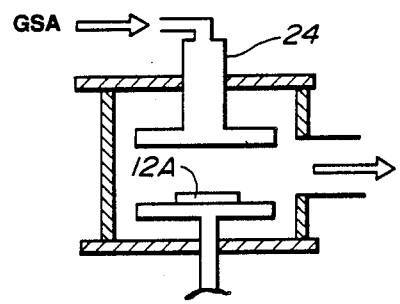
FIG. 2 is a simplified and sectional illustration of a plasma CVD apparatus.

Then the first dielectric layer 16 was formed in a plasma CVD apparatus (24) shown in FIG. 2. Numeral 12A indicates the glass substrate 12 with the tansparent electrode 14 formed theron. First the $SiO_2$ film 16a was desposited to a thickness of 500 Å by using a mixed gas of $SiH_4$ and $N_2O$. The substrate temperature was 375° C., the gas pressure was 0.3 Torr, and the discharge power was 0.44 W/cm$^2$. Next, the $Si_3N_4$ film 14b was deposited to a thickness of 1500 Å by using a mixed gas of $SiH_4$ and $N_2$. The substrate temperature was 375° C., the gas pressure was 0.26–0.28 Torr, and the discharge power was 0.44 W/cm$^2$.

Figure 3:
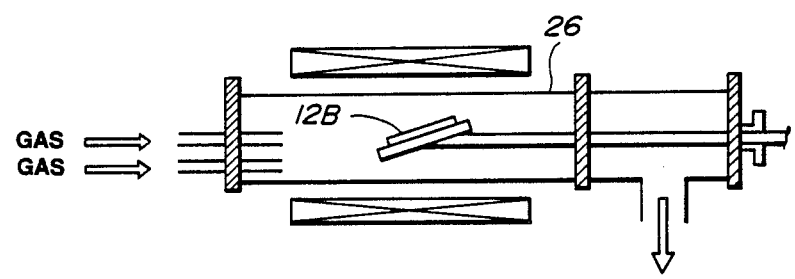
FIG. 3 is a simplified ans sectional illustration of a MOCVD apparatus.

Next, the EL phosphor layer 18 was formed in a MOCVD apparatus (26) shown in FIG. 3 by using a mixed gas containing diethylzinc (DEZ), ethyl mercaptan (EMC) and di-$\pi$-cyclopentadienylmanganese (DCPM). Numeral 12B indicates the glass substrate 12 with the transparent electrode 14 and the dielectric layer 16 formed thereon. In the MOCVD operation the substrate temperature was 450° C., and the reaction gas pressure was 9 Torr. The flow rate of DEZ gas was $2.2 \times 10^{-5}$ mol/min, and the flow rate of EMC gas was $4.5 \times 10^{-4}$ mol/min. DCPM vapor was produced by sublimation at 80° C. and introduced into a carrier gas the flow rate of which was 40 ml/min. As the result a ZnS:Mn film having a thickness of 5000 Å was deposited as the EL phosphor layer 18.

On the ZnS:Mn film 18 the second dielectric layer 20 was formed by the plasma CVD process by first despositing the $Si_3N_4$ film 20b to a thickness of 1500 Å and then the $SiO_2$ film 20a to a thickness of 500 Å. Next, the back electrode 22 was formed by depositing an aluminum film and etching it to leave a series of stripes extending crosswise crosswise of the stripes of the transparent electrode 14 to thereby complete the thin-film EL device 10.

The voltage-brightness characteristic of the thin-film EL device of Example 1 was examined by applying AC voltages of 1 KHz between the transparent electrode 14 and the back electrode 22. The result is represented by the curve (1) in FIG. 4. As can be seen, the driving voltage to obtain brightness of 1 cd/m$^2$, which is taken as the threshold voltage, was as low as about 90 V. The inclination of the curve (1), i.e. the rate of increase in brightness with voltage, was very steep to the extent of brightness of nearly 1000 cd/m$^2$.

Figure 5:
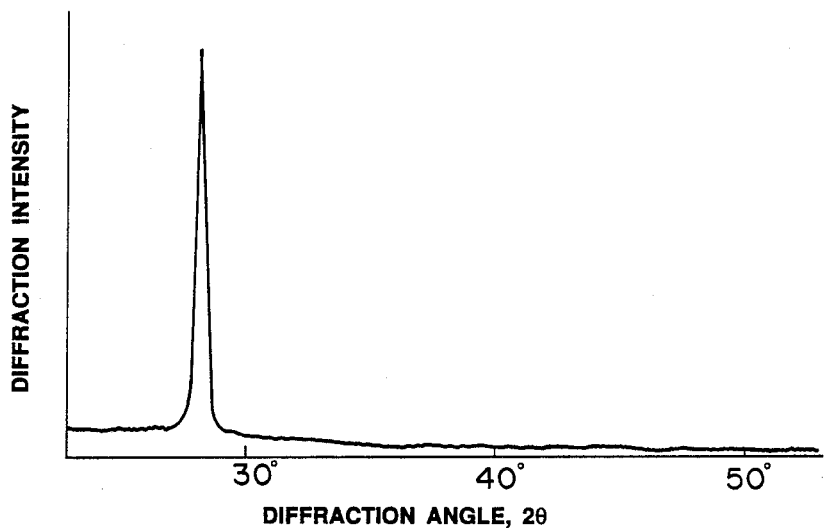
FIG. 5 is a chart showing the X-ray diffraction pattern of a thin film of ZnS:Mn deposited by a method according to the invention.

The crystal structure of the ZnS:Mn film 18 deposited in Example 1 was examined by X-ray diffraction. FIG. 5 shows the obtained X-ray diffraction pattern, in which appears a sharp and high peak at only one diffraction angle. This is indicative of a pillar-like orientation of the deposited crystals perpendicular to the plane of the film 18, which is a very favorable orientation of the crystals.

EXAMPLE 2

Another sample of the thin-film EL device 10 of FIG. 1 was produced by fundamentally the same process as in Example 1. As the sole modification, the plasma CVD operation to deposit the $Si_3N_4$ film 16b, 20b in each of the two dielectric layers 16, 20 was performed for an extended period of time such that each $Si_3N_4$ film 16b, 20b had a thickness of 2500 Å.

Figure 4:
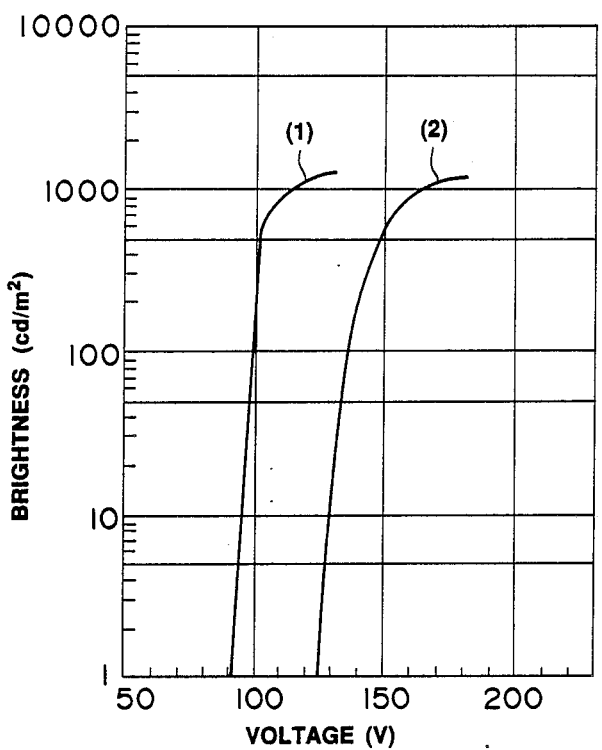
FIG. 4 is a graph showing the voltage-brightness characteristics of two thin-film EL devices produced in Examples of the invention.

The voltage-brightness characteristic of the thin-film EL device produced in Example 2 (driven with AC voltages of 1 KHz) was as represented by the curve (2) in FIG. 4 and, hence, could be regarded as excellent.

What is claimed is:

1. In a method of producing a thin-film electroluminescent device having a thin film of zinc sulfide doped with manganese as an electroluminescent phosphor layer, a pair of electrodes located on the opposite two sides of the phosphor layer, respectively, and a dielectric layer interposed between the phosphor layer and each or predetermined one of the two electrodes, the method including the step of depositing said thin film by a metal-organic chemical vapor deposition process using a mixed gas consisting essentially of an organic zinc compound, an organic sulfur compound and an organic manganese compound, the improvement comprising said mixed gas containing a mercaptan selected from the group consisting of methyl mercaptan and ethyl melcaptan as said organic sulfur compound and di-$\pi$-cyclopentadienylmanganese as said organic manganese compound.

2. A method according to claim 1, wherein said organic zinc compound is selected from the group consisting of dimethylzinc and diethylzinc.

3. A method according to claim 1, further comprising the step of forming said dielectric layer by a plasma chemical vapor deposition process.

4. A method according to claim 3, wherein said dielectric layer is formed as a laminate of a $SiO_2$ film and a $Si_3N_4$ film.

5. A thin-film electroluminescent device produced by a method according to claim 1.

* * * * *